(12) United States Patent
Prueckl

(10) Patent No.: US 8,648,473 B2
(45) Date of Patent: Feb. 11, 2014

(54) CHIP ARRANGEMENT AND A METHOD FOR FORMING A CHIP ARRANGEMENT

(75) Inventor: Anton Prueckl, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 13/430,727

(22) Filed: Mar. 27, 2012

(65) Prior Publication Data

US 2013/0256912 A1   Oct. 3, 2013

(51) Int. Cl.
 *H01L 23/48* (2006.01)
 *H01L 23/52* (2006.01)
 *H01L 29/40* (2006.01)

(52) U.S. Cl.
 USPC ........................................................ 257/777

(58) Field of Classification Search
 USPC ......... 257/777, 685, 686, 723, 726, 276, 625,
   257/675, 706, 707, E23.169–E23.178,
   257/E27.001–E27.163, E25.001–E25.032;
   438/6, 28, 66, 67, 107, 109, 406,
   438/455–459, 15
 See application file for complete search history.

(56) References Cited

U.S. PATENT DOCUMENTS

| | | | |
|---|---|---|---|
| 6,300,146 B1 | 10/2001 | Thierry | |
| 7,045,391 B2 * | 5/2006 | Lin | 438/109 |
| 7,227,198 B2 | 6/2007 | Pavier et al. | |
| 2006/0001145 A1 * | 1/2006 | Ho et al. | 257/690 |
| 2008/0136002 A1 * | 6/2008 | Yang | 257/686 |
| 2008/0157316 A1 * | 7/2008 | Yang | 257/685 |
| 2008/0157341 A1 * | 7/2008 | Yang et al. | 257/700 |
| 2008/0224306 A1 * | 9/2008 | Yang | 257/725 |
| 2008/0246137 A1 | 10/2008 | Mahler et al. | |
| 2009/0039530 A1 * | 2/2009 | Fryklund et al. | 257/778 |

FOREIGN PATENT DOCUMENTS

DE   102006049949 B3   5/2008

* cited by examiner

*Primary Examiner* — Dao H Nguyen
*Assistant Examiner* — Tram H Nguyen

(57) ABSTRACT

A chip arrangement is provided. The chip arrangement includes: a first chip electrically connected to the first chip carrier top side; a second chip electrically connected to the second chip carrier top side; and electrically insulating material configured to at least partially surround the first chip carrier and the second chip carrier; at least one electrical interconnect configured to electrically contact the first chip to the second chip through the electrically insulating material; one or more first electrically conductive portions formed over and electrically contacted to at least one of the first chip carrier top side and second chip carrier top side, and one or more second electrically conductive portions formed over and electrically contacted to at least one of the first chip carrier bottom side and second chip carrier bottom side.

26 Claims, 9 Drawing Sheets

FIG 2    ~ 200

```
┌─────────────────────────────────────────────────────────────┐
│ electrically connecting first chip to first chip carrier top│
│ side, wherein first chip carrier includes first chip carrier│    ~ 210
│        top side and first chip carrier bottom side;         │
└─────────────────────────────────────────────────────────────┘
                              │
┌─────────────────────────────────────────────────────────────┐
│ electrically connecting second chip to second chip carrier  │
│ top side, wherein second chip carrier includes second chip  │    ~ 220
│     carrier top side and second chip carrier bottom side;   │
└─────────────────────────────────────────────────────────────┘
                              │
┌─────────────────────────────────────────────────────────────┐
│  at least partially surrounding first chip carrier and      │
│  second chip carrier with an electrically insulating        │    ~ 230
│  material;                                                  │
└─────────────────────────────────────────────────────────────┘
                              │
┌─────────────────────────────────────────────────────────────┐
│ forming at least one electrical interconnect to electrically│
│ contact first chip to second chip through electrically      │    ~ 240
│ insulating material;                                        │
└─────────────────────────────────────────────────────────────┘
                              │
┌─────────────────────────────────────────────────────────────┐
│ forming one or more first electrically conductive portions  │
│ and one or more second electrically conductive portions     │
│ over electrically insulating material, wherein forming one  │
│ or more first electrically conductive portions and one or   │
│ more second electrically conductive portions over           │
│ electrically insulating material includes forming one or    │    ~ 250
│ more first electrically conductive portions over and        │
│ electrically contacting one or more first electrically      │
│ conductive portions to at least one of first chip carrier   │
│ top side and second chip carrier top side, and forming one  │
│ or more second electrically conductive portions over and    │
│ electrically contacting one or more first electrically      │
│ conductive portions to at least one of first chip carrier   │
│ bottom side and second chip carrier bottom side.            │
└─────────────────────────────────────────────────────────────┘
```

US 8,648,473 B2

CHIP ARRANGEMENT AND A METHOD FOR FORMING A CHIP ARRANGEMENT

TECHNICAL FIELD

Various embodiments relate generally to a chip arrangement and a method for forming a chip arrangement.

BACKGROUND

Many challenges are associated with device packages for multiple chips. Usually, a multi-chip package may be pieced together by several single-chip packages. A typical example is an integrated circuit IC controlled half-bridge switch consisting of two power semiconductors and one driver IC. Each semiconductor chip may be packaged using standard packaging technologies, and assembled with core processes, e.g. die attaching, wire bonding & molding. The single-chip packages may finally be electrically interconnected on a PCB. Poor electrically and thermal device performances are obtained as a result of restrictions to the use of standard interconnect technologies, such as wire-bonding. Furthermore, the manufacturing may be inefficient and costly, as manufacturing may be usually carried out in serial processes.

SUMMARY

Various embodiments provide a chip arrangement including: a first chip carrier including a first chip carrier top side and a first chip carrier bottom side; a second chip carrier including a second chip carrier top side and a second chip carrier bottom side; a first chip electrically connected to the first chip carrier top side; a second chip electrically connected to the second chip carrier top side; an electrically insulating material configured to at least partially surround the first chip carrier and the second chip carrier; at least one electrical interconnect configured to electrically contact the first chip to the second chip through the electrically insulating material; and one or more first electrically conductive portions and one or more second electrically conductive portions formed over the electrically insulating material, wherein the one or more first electrically conductive portions are formed over and electrically contacted to at least one of the first chip carrier top side and second chip carrier top side, and wherein the one or more second electrically conductive portions are formed over and electrically contacted to at least one of the first chip carrier bottom side and second chip carrier bottom side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for forming a chip arrangement according to an embodiment;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a multi-chip laminated package wherein a device may be laminated, and wherein redistribution layers may be provided on one or more sides of the device.

Various embodiments provide a multi-chip device package, encapsulated with one or more same or different laminated foils.

Various embodiments provide a chip arrangement, including a metal carrier, e.g. a carrier including copper, attached to a device back side, one or more metal vias, e.g. Cu vias, as device interconnects, and at least two redistribution layers, Various embodiments provide a method for providing different processes such as foil lamination for encapsulation and via production for the device interconnects to the periphery, wherein the processes may be conducted in parallel for package assembly.

Figure 1:
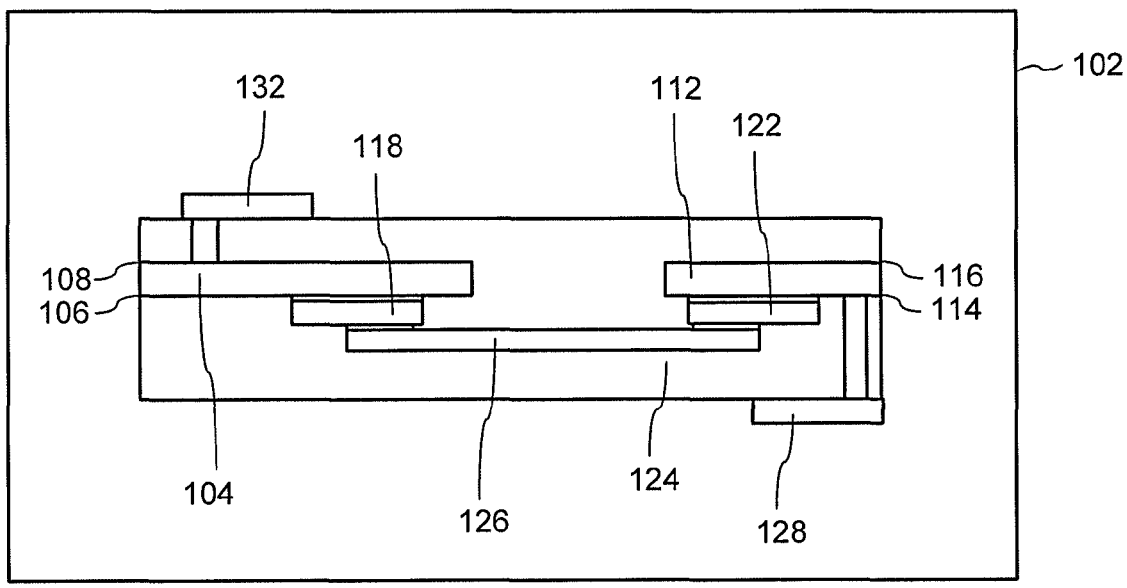
FIG. 1 shows a chip arrangement according to an embodiment.

FIG. 1 shows chip arrangement 102 according to an embodiment. Chip arrangement 102 may include first chip carrier 104, wherein first chip carrier 104 may include first chip carrier top side 106 and first chip carrier bottom side 108. Chip arrangement 102 may include second chip carrier 112, wherein second chip carrier 112 may include second chip carrier top side 114 and second chip carrier bottom side 116. Chip arrangement 102 may include first chip 118, e.g. a semiconductor chip, e.g. a semiconductor die, electrically connected to first chip carrier top side 106, and second chip 122 electrically connected to second chip carrier top side 114. Chip arrangement 102 may include electrically insulating material 124 configured to at least partially surround first chip carrier 104 and second chip carrier 106. Chip arrangement 102 may include at least one electrical interconnect 126 configured to electrically contact first chip 118 to second chip 122 through electrically insulating material 124. Chip arrangement 102 may include one or more first electrically conductive portions 128 and one or more second electrically conductive portions 132 formed over electrically insulating material 124, wherein one or more first electrically conductive portions 128 may be formed over and electrically contacted to at least one of first chip carrier top side 106 and second chip carrier top side 114, and wherein one or more second electrically conductive portions 132 may be formed over and electrically contacted to at least one of first chip carrier bottom side 108 and second chip carrier bottom side 116.

FIG. 2 shows method 200 for forming a chip arrangement according to an embodiment. Method 200 may include:

electrically connecting first chip to first chip carrier top side, wherein first chip carrier includes first chip carrier top side and first chip carrier bottom side (in 210);

electrically connecting second chip to second chip carrier top side, wherein second chip carrier includes second chip carrier top side and second chip carrier bottom side (in 220);

at least partially surrounding first chip carrier and second chip carrier with an electrically insulating material (in 230);

forming at least one electrical interconnect to electrically contact first chip to second chip through electrically insulating material (240);

forming one or more first electrically conductive portions and one or more second electrically conductive portions over electrically insulating material, wherein forming one or more first electrically conductive portions and one or more second electrically conductive portions over electrically insulating material includes forming one or more first electrically conductive portions over and electrically contacting one or more first electrically conductive portions to at least one of first chip carrier top side and second chip carrier top side, and forming one or more second electrically conductive portions over and electrically contacting one or more first electrically conductive portions to at least one of first chip carrier bottom side and second chip carrier bottom side (in 250).

FIGS. 3A to 3I show method 300 for forming a chip arrangement according to an embodiment.

Figure 3A:
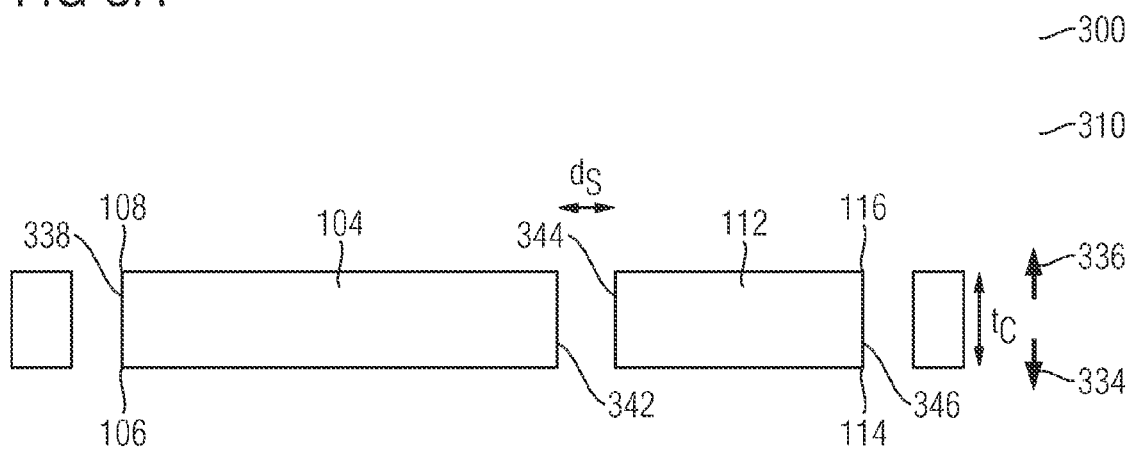
FIGS. 3A to 3I show a method for forming a chip arrangement according to an embodiment.

FIG. 3A shows a plurality of structured carriers, e.g. lead frames. First chip carrier 104 may include first chip carrier top side 106 and first chip carrier bottom side 108, wherein first chip carrier top side 106 may face a direction opposite to the direction which first chip carrier bottom side 108 faces. For example, first chip carrier 104 may be arranged, wherein first chip carrier top side 106 may face direction 334, which faces a direction opposite to direction 336 which first chip carrier bottom side 108 faces.

Second chip carrier 112 may include second chip carrier top side 114 and second chip carrier bottom side 116, wherein second chip carrier top side 114 may face a direction opposite to the direction which second chip carrier bottom side 116 faces. For example, second chip carrier 112 may be arranged, wherein second chip carrier top side 114 may face direction 334, which faces a direction opposite to direction 336 which second chip carrier bottom side 116 faces.

In 310, first chip carrier 104 and second chip carrier 112 may be arranged adjacent to each other (however, except of a common temporary substrate onto which they are arranged, and which they may temporarily share, they are mechanically decoupled from each other; in other words, first chip carrier 104 and second chip carrier 112 may be arranged adjacent to each other, independently and separated from each other, onto a common carrier, e.g. common substrate). First chip carrier 104 and second chip carrier 112 may be arranged adjacent to each other, but separated by separation distance $d_s$. Separation distance $d_s$ may range from about 10 µm to about 10 mm, e.g. from about 50 µm to about 2 mm, e.g. from about 100 µm to about 500 mm. First chip carrier 104 and second chip carrier 112 may be arranged, but are not limited to being arranged, wherein first chip carrier top side 106 and second chip carrier top side 114 may face the same direction and wherein first chip carrier bottom side 108 and second chip carrier bottom side 116 may face the same direction. First chip carrier 104 and second chip carrier 112 may be arranged, but are not limited to being arranged, wherein first chip carrier top side 106 and second chip carrier top side 114 may lie substantially level to each other.

First chip carrier 104 may include first chip carrier lateral sides 338, 342, wherein first chip carrier lateral sides lateral sides 338, 342 may be arranged between first chip carrier top side 106 and first chip carrier bottom side 108. For example, first chip carrier lateral sides 338, 342 may connect first chip carrier top side 106 to first chip carrier bottom side 108, wherein first chip carrier lateral side 338 may face a direction opposite to a direction which first chip carrier lateral side 342 faces.

Second chip carrier 112 may include second chip carrier lateral sides 344, 346, wherein second chip carrier lateral sides 344, 346 may be arranged between second chip carrier top side 114 and second chip carrier bottom side 116. For example, second chip carrier lateral sides 344, 346, may connect second chip carrier top side 114 to second chip carrier bottom side 116, wherein second chip carrier lateral side 344 may face a direction opposite to a direction which second chip carrier lateral side 346 faces.

First chip carrier 104 and second chip carrier 112 may be arranged, but are not limited to being arranged, adjacent to each other, wherein first chip carrier lateral side 342 may be adjacent to second chip carrier lateral side 344. For example, first chip carrier 104 and second chip carrier 112 may be arranged adjacent to each other, but may lie on different vertical and/or horizontal planes from each other, as long as they are mechanically decoupled from each other.

First chip carrier 104 may include a first lead frame carrier, e.g. a lead frame. Second chip carrier 112 may include a second lead frame carrier, e.g. lead frame.

At least one of first chip carrier 104 and second chip carrier 112 may include a structure metal foil and/or carrier material.

At least one of first chip carrier 104 and second chip carrier 112 may include at least one from the following group of materials, the group of materials consisting of: copper, nickel, iron, copper alloy, nickel alloy, iron alloy.

At least one of first chip carrier 104 and second chip carrier 112 may have a top side to bottom side thickness $t_C$ thicker than 50 µm. At least one of first chip carrier 104 and second chip carrier 112 may have a top side to bottom side thickness $t_C$ thicker than 75 µm.

At least one of first chip carrier 104 and second chip carrier 112 may have a top side to bottom side thickness $t_C$ ranging from about 200 µm to about 300 µm, e.g. from about 220 µm to about 280 µm, e.g. from 240 µm to about 260 µm.

At least one of first chip carrier 104 and second chip carrier 112 may be configured as a heat dissipater.

Figure 3B:
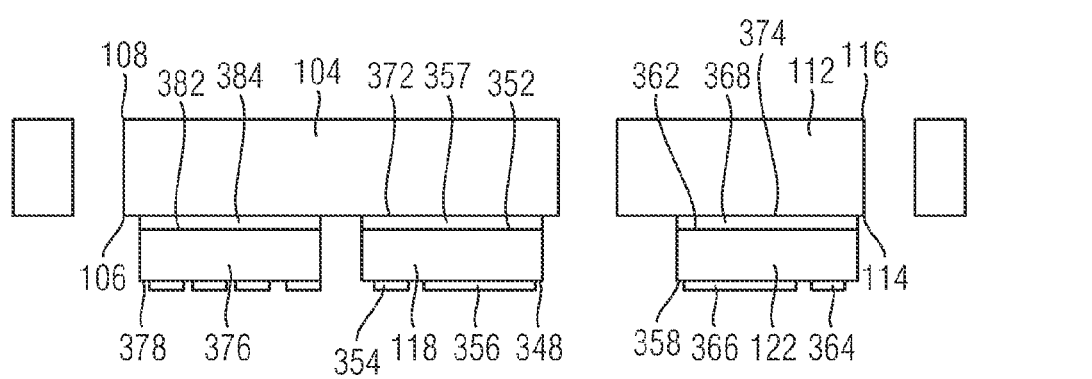
Figure 3C:
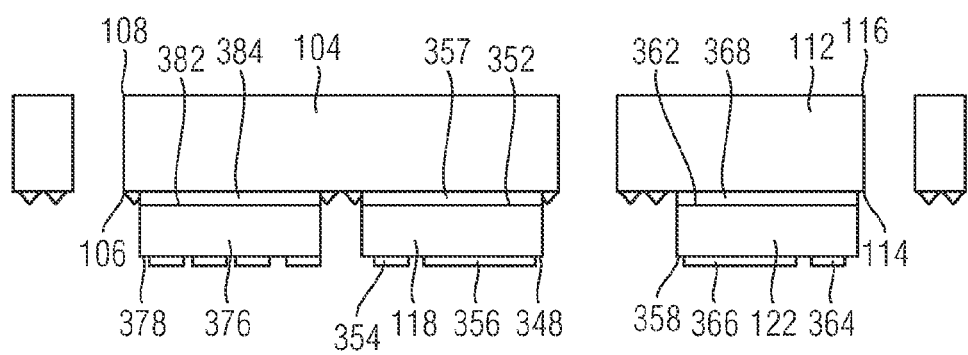
Figure 3D:
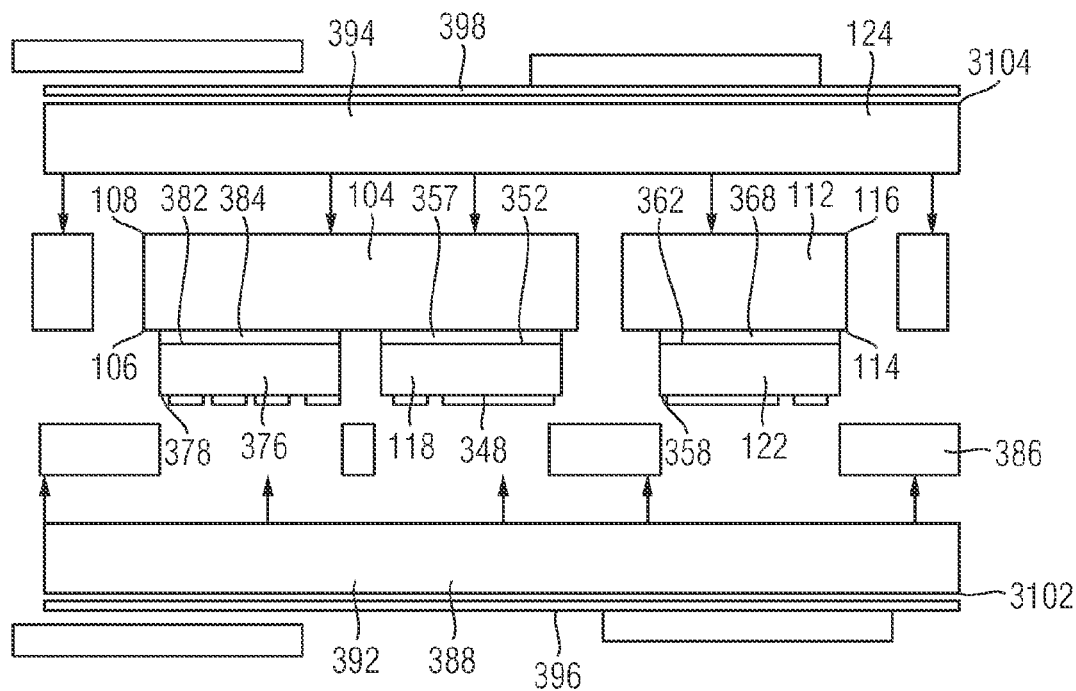
Figure 3E:
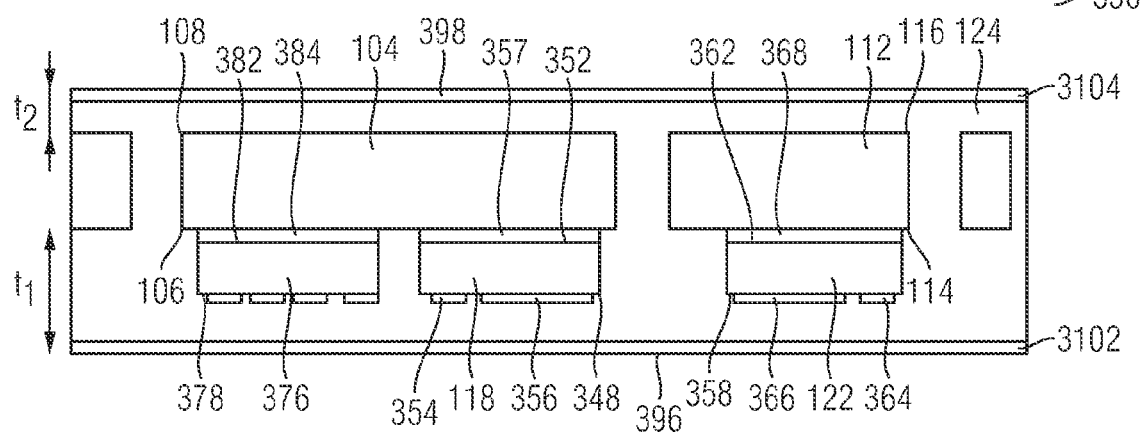
Figure 3F:
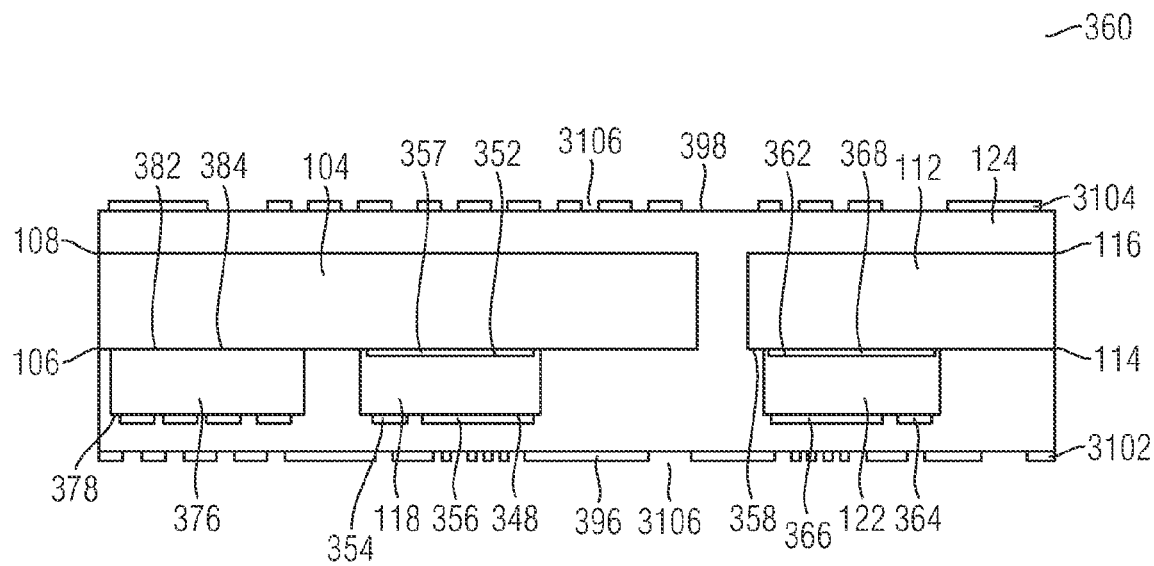
Figure 3G:
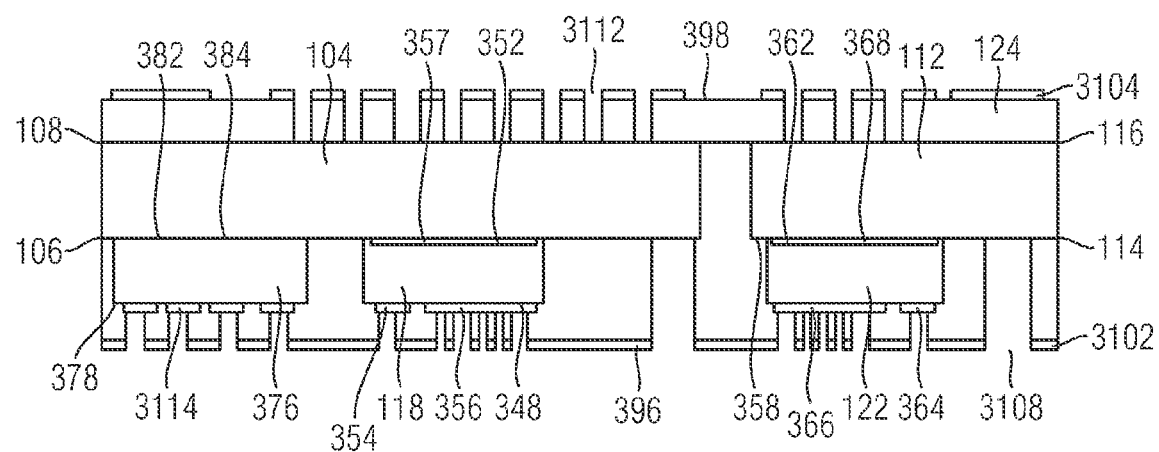
Figure 3H:
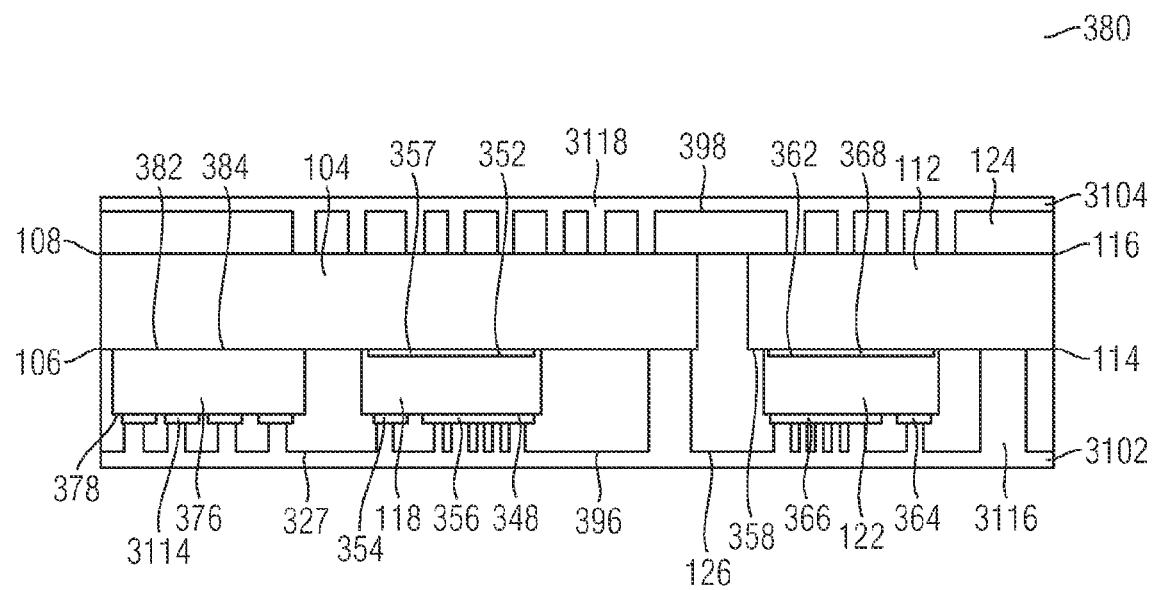
Figure 3I:
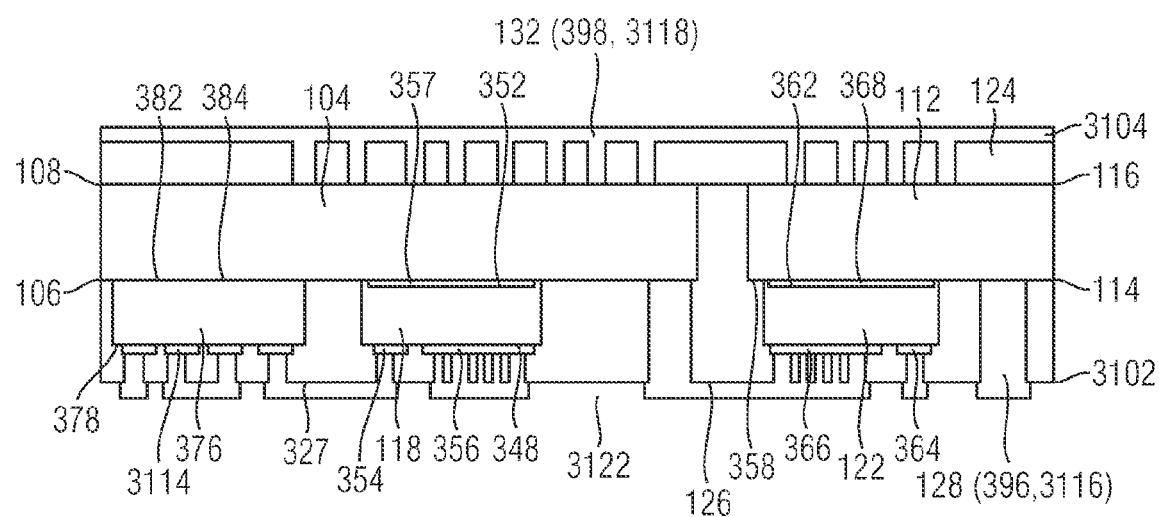

FIG. 3B shows one or more die attach processes. In 320, method 300 may include, electrically connecting first chip 118 to first chip carrier top side 106, wherein first chip carrier 104 may include first chip carrier top side 106 and first chip carrier bottom side 108. Method 300 may further include electrically connecting second chip 122 to second chip carrier top side 114, wherein second chip carrier 112 may include second chip carrier top side 114 and second chip carrier bottom side 116. At least one of first chip 118 and second chip 122 may have a thickness (between top to bottom) ranging from about 5 µm to about 500 µm, e.g. from about 10 µm to about 250 µm e.g. from about 20 µm to about 100 µm. At least one of first chip 118 and second chip 122 may have a size, e.g. a surface area, ranging from about 50 mm² to about 0.1 mm², e.g. from about 20 mm² to about 0.25 mm², e.g. from about 10 mm² to about 0.5 mm².

First chip 118 and second chip 122 may each include a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device. For example, first chip 118 and second chip 122 may include a power transistor.

First chip 118 and second chip 122 may each include a power semiconductor device, wherein the power semiconductor device may be capable of carrying a voltage of up to approximately 600 V.

First chip 118 may include top side 348 and bottom side 352, wherein top side 348 may face a direction opposite to the direction which bottom side 352 faces.

First chip 118 may include a gate region contact 354 and at least one first source/drain region contact 356 formed over, e.g. directly on or indirectly on, top side 348, and at least one second source/drain region contact 357 formed over bottom side 352. Each of the contacts 354, 356 may include an electrically conductive contact pad. Each electrically conductive contact pad including at least one material, element or alloy from the following group of materials, the group consisting of: copper, aluminum, silver, tin, gold, palladium, zinc, nickel. Each of the contacts 354, 356 may be electrically isolated from each other over top side 348 of first chip 118. For example, gate region contact 354 may be electrically isolated from at least one first source/drain region contact 356 by an electrically insulating material, e.g. silicon dioxide or polyimide or nitride, formed over top side 348. Electrically insulating material 124 described hereinafter, may also be used to electrically isolate gate region contact 354 from at least one first source/drain region contact 356.

Top side may also be referred to as a "first side", "front side" or "upper side" of the chip. The terms "top side", "first side", "front side" or "upper side" may be used interchangeably hereinafter. Bottom side may also be referred to as "second side" or "back side" of the chip. The terms "second side", "back side", or "bottom side" may be used interchangeably hereinafter.

As used herein with respect to semiconductor power devices, the terms "top side", "first side", "front side" or "upper side" may be understood to refer to the side of the chip wherein a gate region and at least one first source/drain region may be formed. The terms "second side", "back side", or "bottom side" may be understood to refer to the side of the chip wherein a second source/drain region may be formed. Therefore, a semiconductor power transistor may support a vertical current flow through the chip between a first source/drain region over top side 348 and a second source/drain region over bottom side 352.

Second chip 122 may include a semiconductor power transistor including top side 358 and bottom side 362. Similarly, second chip 122 may include gate region contact 364 and at least one first source/drain region contact 366 formed over top side 358, and at least one second source/drain region contact 368 formed over bottom side 362. Gate region contact 364 may be electrically isolated from at least one first source/drain region contact 366 by an electrically insulating material, e.g. silicon dioxide or polyimide or nitride, formed over top side 358. Electrically insulating material 124 described hereinafter, may also be used to electrically isolate gate region contact 364 from at least one first source/drain region contact 366.

First chip 118 may be disposed over first chip carrier 104, and first chip 118 may be electrically connected to first chip carrier 104 via at least one contact pad, e.g. second source/drain region contact 357 formed over first chip back side 352.

Similarly, second chip 122 may be disposed over second chip carrier 112, and second chip 122 may be electrically connected to second chip carrier 112 via at least one contact pad, e.g. second source/drain region contact 368 formed over second chip back side 362. Each electrically conductive contact pad may include at least one material, element or alloy from the following group of materials, the group consisting of: copper, aluminum, silver, tin, gold, zinc, nickel.

First chip 118 may be electrically connected to first chip carrier 104 via an electrically conductive medium 372. Second chip 122 may be electrically connected to second chip carrier 112 via an electrically conductive medium 374. First chip 118 may be electrically connected to first chip carrier 104 and second chip 122 may be electrically connected to second chip carrier 112 in a parallel process, wherein both chips 118, 122 may be adhered to the respective chip carriers 104, 112 in the same process.

Electrically conductive medium 372 and electrically conductive medium 374 may each include at least one from the following group of materials, the group consisting of: a solder, a soft solder, a diffusion solder, a paste, a nanopaste, an adhesive, an electrically conductive adhesive, a thermally conductive adhesive. Electrically conductive medium 372 and electrically conductive medium 374 may each include at least one from the following group of elements, the group of elements consisting of: Ag, Zn, Sn, Pb, Bi, In, Cu, Au, Pd. Electrically conductive medium 372 and electrically conductive medium 374 may include the same or different materials.

In addition, one or more electrically insulated integrated circuit chips may each be electrically insulatively bonded onto at least one of first chip carrier 104 and second chip carrier 112.

Third chip 376 may include a semiconductor integrated circuit logic chip, wherein the semiconductor integrated circuit logic chip may include at least one semiconductor logic device from the group of semiconductor logic devices, the group consisting of: an application specific integrated chip ASIC, a driver, a controller, a sensor, a memory. It may be understood that a semiconductor logic chip i.e. a logic integrated circuit chip, may include a low power semiconductor device, e.g. devices capable of carrying up to 30 V to 150 V.

Third chip 376 may be disposed over first chip carrier 104. Third chip 376 may be electrically insulated from first chip carrier 104.

Third chip 376 may include third chip top side 378 and third chip bottom side 382. Third chip bottom side 382, i.e. back side, may be disposed over first chip carrier 104 or disposed over chip backside e.g. $SiO_2$.

As used herein with respect to lower power semiconductor logic devices, third chip top side 378, may be understood to refer to the side of the chip which carries one or more contact pads, or electrical contacts, wherein bonding pads or electrical connects may be attached; or wherein it is the side of the chip which may be mostly covered by metallization layers. Third chip bottom side 382 may be understood to refer to the side of the chip which may be free from metallization or contact pads or electrical contacts. metallization layers. Third chip bottom side 382 may be adhered to first chip carrier 104 by electrically insulating medium 384. Therefore, third chip 376 may be electrically insulated from first chip carrier 104 by electrically insulating medium 384. Electrically insulating medium 384 may include at least one from the following group of materials, the group consisting of: an adhesive, an electrically insulating adhesive, an epoxy, a glue, a paste, an adhesive foil, an adhesive film, an electrically insulating wafer backside coating. Each electrically conductive contact pad may include at least one material, element or alloy from the following group of materials, the group consisting of: copper, aluminum, silver, tin, gold, zinc, nickel.

Process 320, therefore shows a die attachment process, wherein first chip 118 and second chip 112 may be attached to respective chip carriers by soldering of an electrically conductive backside interconnect, and third chip 376 may be attached to first chip carrier 104 by an electrically insulating die attach process, e.g. electrical insulation die attach paste or film.

First chip 108, second chip 112 and third chip 114 may each include a semiconductor chip, e.g. a die, which includes a wafer substrate. The semiconductor chip may include one or more electronic components formed over the wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

In 330, after the completed die-attach processes, the surfaces of the devices may be roughened, e.g. by a chemical etching process, for improved adhesion of a subsequent deposition electrically insulating material 124. During the chemical etching process, first chip carrier 104 and second chip carrier 112 may be roughened. For example, first chip carrier top side 106 and second chip carrier top side 114 may be roughened by the chemical etching process. Furthermore, one or more sides of first chip 118, second chip 122 and third chip 376 may be roughened. For example, first chip top side 348, second chip top side 358 and third chip top side 378 may be roughened by the chemical etching process. Adhesion of electrically insulating material 124 to these sides may be improved due to the roughening process.

Method 300 may include, in 340 and 350, at least partially surrounding first chip carrier 104 and second chip carrier 112 with electrically insulating material 124.

Electrically insulating material 124 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to various embodiments, electrically insulating material 124 may include an unstructured laminate material with or without one or more particle fillers. One or more particle fillers may include silicon dioxide particle fillers, aluminum oxide particle fillers, e.g. glass filler particles, e.g. nanoparticles, or glass fibers, silicon dioxide particle fillers, aluminum oxide. Electrically insulating material 124 may be free from prepegs.

Electrically insulating material 124 may be further configured to at least partially surround first chip 118 and second chip 122. Electrically insulating material 124 may be further configured to electrically insulate first chip 118 and first chip carrier 104 from second chip 122 and second chip carrier 112. Electrically insulating material 124 may be formed over first and second chip carrier top sides 106, 114, and first and second chip carrier bottom sides 108, 116.

Electrically insulating material 124 may be deposited using one or more deposition processes. Electrically insulating material 124 may be deposited such that electrically insulating material 124, i.e. unstructured epoxy may at least partially surround first chip 118, second chip 122 and third chip 376. Electrically insulating material 124 may be deposited between first chip 118 and second chip 122. Electrically insulating material 124 may be deposited between first chip 118 and third chip 114. Electrically insulating material 124 may be deposited between first chip carrier 104 and second chip carrier 116. Electrically insulating material 124 may be deposited, such that electrically insulating material 124 may at least partially surround first chip carrier 104 and second chip carrier 112. Electrically insulating material 124 may be deposited, such that first chip 118 may be electrically insulated from second chip 122. Electrically insulating material 124 may be deposited, such that first chip 118 may be electrically insulated from third chip 376. Electrically insulating material 124 may be further deposited, e.g. over one or more sides of first chip 118, second chip 122 and third chip 376. Electrically insulating material 124 may be deposited to at least partially surround first chip top side 348, second chip top side 358 and third chip top side 378. Electrically insulating material 124 may be deposited to at least partially surround one or more lateral sides of each of first chip 118, second chip 122 and third chip 376. Electrically insulating material 124 may be deposited to at least partially surround first chip carrier top side 106 and second chip carrier top side 114. Electrically insulating material 124 formed over first chip carrier top side 106 and second chip carrier top side 114 may have a thickness $t_1$ ranging from about 5 μm to about 500 μm, e.g. from about 15 μm to about 150 μm. Electrically insulating material 124 may be deposited to at least partially surround first chip carrier bottom side 108 and second chip carrier bottom side 116. Electrically insulating material 124 formed over first chip carrier bottom side 108 and second chip carrier bottom side 116 may have a thickness $t_2$ ranging from about 5 μm to about 500 μm, e.g. from about 15 μm to about 150 μm.

According to another embodiment, electrically insulating material 124 may include first electrically insulating material 386 and second electrically insulating material 388. First electrically insulating material 386, may include structured pre-impregnated composite fibers 386, e.g. glass-fibers and glass particles reinforced prepregs. Second electrically insulating material 388 may include an unstructured laminate material with or without one or more particle fillers. First electrically insulating material 386 may at least partially surround first chip 118, second chip 122 and third chip 376. First electrically insulating material 386 may be deposited between first chip 118 and second chip 122. First electrically insulating material 386 may be deposited between first chip 118 and third chip 114. First electrically insulating material 386 may be deposited between first chip carrier 104 and second chip carrier 116. First electrically insulating material 386 may be deposited, such that electrically insulating material 368 may at least partially surround first chip carrier 104 and second chip carrier 112. In a parallel or subsequent process, second electrically insulating material 388 may be further deposited, e.g. over one or more sides of first chip 118, second chip 122 and third chip 376. Second electrically insulating material 388 may include an unstructured epoxy 388. Second electrically insulating material 388 may include glass-fibers and glass particles reinforced laminate foil, e.g. top side laminate foil 392 and bottom side laminate foil 394. Second electrically insulating material 388 may be deposited to at least partially surround first chip top side 348, second chip top side 358 and third chip top side 378. Second electrically insulating material 388 may be deposited to at least partially surround one or more lateral sides of each of first chip 118, second chip 122 and third chip 376. Second electrically insulating material 388, e.g. top side laminate foil 392, may be deposited to at least partially surround first chip carrier top side 106 and second chip carrier top side 114. Second electrically insulating material 388, e.g. bottom side laminate foil 394, may be deposited to at least partially surround first chip carrier bottom side 108 and second chip carrier bottom side 116.

It may be understood that adhesion of electrically insulating material 124, e.g. at least one of first electrically insulating material 386 and second electrically insulating material 388, to first chip carrier 104 and second chip carrier 112 may be improved due to the roughening process of 330.

First electrically conductive redistribution material 396 may be deposited over electrically insulating material 124. First electrically conductive redistribution material 396 may be deposited over at least one of first chip carrier top side 106 and second chip carrier top side 114. Second electrically conductive redistribution material 398 may be deposited over electrically insulating material 124. Second electrically conductive redistribution material 398 may be deposited over at least one of first chip carrier bottom side 108 and second chip carrier bottom side 116.

First electrically conductive redistribution material 396 may be disposed over a surface of electrically insulating material 124, e.g. over top surface 3102 of electrically insulating material 124, wherein top surface 3102 may be arranged over at least one of first chip carrier top side 106 and second chip carrier top side 114. Top surface 3102 may face the same direction which first carrier top side 106 and second carrier top side 114 face. Second electrically conductive redistribution material 398 may be disposed over a surface of electrically insulating material 124, e.g. over bottom surface 3104 of electrically insulating material 124. Bottom surface 3104 of electrically insulating material 124 may face the same direction which first carrier bottom side 108 and second carrier bottom side 116 face. Second electrically conductive redistribution material 398 may be arranged over at least one of first chip carrier bottom side 108 and second chip carrier bottom side 116. This roughening, i.e. etching process may be performed for one or more or all subsequent galvanic deposited Cu-layers inside the laminated package.

At least one of first electrically conductive redistribution material 396 and second electrically conductive redistribution material 398 may include an electrically conductive foil, e.g. a metal foil, e.g. a copper foil. At least one of first electrically conductive redistribution material 396 and second electrically conductive redistribution material 398 may have a thickness ranging from about 5 µm to about 30 µm, e.g. about 10 µm to about 20 µm, e.g. about 15 µm to about 20 µm.

According to an embodiment, first electrically conductive redistribution material 396, second electrically conductive redistribution material 398 and electrically insulating material 124 may be deposited in a parallel process, i.e. in the same process.

First electrically conductive redistribution material 396 and second electrically conductive redistribution material 398 may be pressed onto electrically insulating material 124, e.g. first electrically conductive redistribution material 396 may be pressed onto top side laminate foil 392 and second electrically conductive redistribution material 398 may be pressed onto bottom side laminate foil 394. First electrically conductive redistribution material 396 may be pressed onto top surface 3102 of electrically insulating material 124. Second electrically conductive redistribution material 398 may be pressed onto bottom surface 3104 of electrically insulating material 124. Therefore, first chip carrier 104, second chip carrier 112, first chip 118, second chip 122, and third chip 376 may be sandwiched between first electrically conductive redistribution material 396, second electrically conductive redistribution material 398 and electrically insulating material 124. Therefore, an encapsulated chip arrangement as shown in 350 FIG. 3E may be formed. For example, first electrically conductive redistribution material 396, second electrically conductive redistribution material 398 and electrically insulating material 124 may be arranged over a temporary carrier and inserted into a press, e.g. a lamination press. The lamination process may be carried out under vacuum using a temperature process, e.g. at about 200° C. and a pressure process, e.g. at about 10 Torr.

In 360, structuring of first electrically conductive redistribution material 396 and second electrically conductive redistribution material 398 may be carried out for subsequent via formation and via filling processes. A photoresist process may be carried out. Photoresist may be deposited, e.g. laminated over first electrically conductive redistribution material 396 and second electrically conductive redistribution material 398. Structuring of the photoresist may be carried out, e.g. using laser direct imaging LDI or a mask process with a mask aligner. Developing may be carried out such that one or more portions of the photoresist may be removed, and one or more regions of first electrically conductive redistribution material 396 and second electrically conductive redistribution material 398 may be exposed to structuring, and one or more other regions of first electrically conductive redistribution material 396 and second electrically conductive redistribution material 398 may be protected from structuring. The structuring process may include etching, which may be used to remove one or more regions 3106 of first electrically conductive redistribution material 396 and second electrically conductive redistribution material 398 which were exposed to structuring and removed during developing. A stripping process may be carried out remove any residue, and remaining photoresist. The removed one or more regions 3106 of first electrically conductive redistribution material 396 and second electrically conductive redistribution material 398 may expose one or more regions of electrically insulating material 124 to restructuring.

In 370, laser drilling may be carried out. One or more regions of electrically insulating material 124, exposed as a result of the removal of one or more regions 3106 of first electrically conductive redistribution material 396 and second electrically conductive redistribution material 398, may be restructured, e.g. by using a drilling process, e.g. laser drilling. The laser drilling may be carried out, e.g. using a laser, e.g. a $CO_2$ laser. Laser drilling may be carried out to produce one or more vias 3108, 3112, i.e. holes.

One or more top side vias 3108 may be formed over at least one of first chip carrier top side 106 and second chip carrier top side 114. One or more top side vias 3108 may be formed over at least one of first chip top side 348, second chip top side 358 and third chip top side 378.

One or more top side vias 3108 may include one or more channels from first electrically conductive redistribution material 396, over top surface 3102 of electrically insulating material 124, to one or more contact pads formed over first chip top side 348, e.g. One or more top side vias 3108 may include one or more channels from first electrically conductive redistribution material 396 to first chip first source/drain contact region 356, e.g. One or more top side vias 3108 may include one or more channels from first electrically conductive redistribution material 396 to first chip gate contact region 354.

One or more top side vias 3108 may include one or more channels from first electrically conductive redistribution material 396 to one or more contact pads formed over second chip top side 358, e.g. One or more top side vias 3108 may include one or more channels from first electrically conductive redistribution material 396 to second chip first source/drain contact region 366, e.g. One or more top side vias 3108 may include one or more channels from first electrically conductive redistribution material 396 to second chip gate contact region 364

One or more top side vias 3108 may include one or more channels from first electrically conductive redistribution material 396 to one or more contact pads 3114 formed over third chip top side 378.

One or more top side vias 3108 may include one or more channels from first electrically conductive redistribution material 396 to first chip carrier top side 106. One or more top side vias 3108 may include one or more channels from first electrically conductive redistribution material 396 to second chip carrier top side 114.

One or more bottom side vias 3112 may be formed over at least one of first chip carrier bottom side 108 and second chip carrier bottom side 116. One or more bottom side vias 3112 may be formed over at least one of first chip bottom side 352, second chip bottom side 362 and third chip bottom side 382.

One or more bottom side vias 3112 may include one or more channels from second electrically conductive redistribution material 398 to first chip carrier bottom side 108. One or more bottom side vias 3112 may include one or more channels from second electrically conductive redistribution material 398 to second chip carrier bottom side 116.

In 380, via filling may be carried out to provide contact metallization. One or more electrically interconnects may be deposited to fill one or more top side vias 3108 and one or more bottom side vias 3112. During via filling process, the thickness of at least one of first electrically conductive redistribution material 396 and second electrically conductive redistribution material 398, i.e. the top and bottom Cu layer 396 and 398 may be increased to such that a thickness ranging from about 20 µm to about 200 µm, e.g. from about 30 µm to about 180 µm, e.g. from about 40 µm to about 160 µm, may be attained.

Chemical activation and/or galvanic deposition may be carried out to provide metallization of the vias for the interconnects. A desmear and/or cleaning process may be carried out, wherein the surfaces of vias 3108, 3112 may be prepared for plating. An activation process may be carried out wherein an enabling layer (not shown) may be deposited to enable plating of the side walls of vias 3108, 3112. Enabling layer may include an electrically conductive layer, e.g. conductive organic layer or Pd layer. Subsequently, a plating process may be carried out and electrically conductive material forming one or more electrically conductive interconnects may be deposited into vias 3108, 3112.

One or more electrically conductive interconnects may include one or more top side electrically conductive interconnects 3116 filling one or more top side vias 3108 and one or more bottom side second electrically conductive interconnects 3118 filling one or more bottom side vias 3112. At least one of one or more top side electrically conductive interconnects 3116 and one or more bottom side second electrically conductive interconnects 3118 may include at least one from the following group of materials, the group of materials consisting of: copper, nickel, iron, copper alloy, nickel alloy, iron alloy.

One or more top side electrically conductive interconnects 3116 may be formed over at least one of first chip carrier top side 106 and second chip carrier top side 114. One or more top side electrically conductive interconnects 3116 may be formed over at least one of first chip top side 348, second chip top side 358 and third chip top side 378.

One or more top side electrically conductive interconnects 3116 may electrically connect first electrically conductive redistribution material 396 to one or more contact pads formed over first chip top side 348, e.g. One or more top side electrically conductive interconnects 3116 may electrically connect first electrically conductive redistribution material 396 to first chip first source/drain contact region 356, e.g. One or more top side electrically conductive interconnects 3116 may electrically connect first electrically conductive redistribution material 396 to first chip gate contact region 354.

One or more top side electrically conductive interconnects 3116 may electrically connect first electrically conductive redistribution material 396 to one or more contact pads formed over second chip top side 358, e.g. One or more top side electrically conductive interconnects 3116 may electrically connect first electrically conductive redistribution material 396 to second chip first source/drain contact region 366, e.g. One or more top side electrically conductive interconnects 3116 may electrically connect first electrically conductive redistribution material 396 to second chip gate contact region 364.

One or more top side electrically conductive interconnects 3116 may electrically connect first electrically conductive redistribution material 396 to one or more contact pads 3114 formed over third chip top side 378.

One or more top side electrically conductive interconnects 3116 may electrically connect first electrically conductive redistribution material 396 to first chip carrier top side 106. One or more top side electrically conductive interconnects 3116 may electrically connect first electrically conductive redistribution material 396 to second chip carrier top side 114.

One or more bottom side electrically conductive interconnects 3118 may be formed over at least one of first chip carrier bottom side 108 and second chip carrier bottom side 116. One or more bottom side electrically conductive interconnects 3118 may electrically connect at least one of first chip bottom side 352, second chip bottom side 362 and third chip bottom side 382.

One or more bottom side electrically conductive interconnects 3118 may electrically connect second electrically conductive redistribution material 398 to first chip carrier bottom side 108. One or more bottom side second electrically conductive interconnects 3118 may electrically connect second electrically conductive redistribution material 398 to second chip carrier bottom side 116.

In 380, during via filling, at least one electrical interconnect 126 may be deposited, which electrically contacts first chip 118 to second chip 122 through electrically insulating material 124. At least one electrical interconnect 126 may include at least one of one or more top side electrically conductive interconnects 3116.

At least one electrical interconnect 126 may be configured to electrically contact first chip 118 to second chip 122 via first chip carrier 104. At least one electrical interconnect 126 may be configured to electrically connect one or more contact pads, e.g. second chip first source/drain region 366, formed over second chip front side 368 to first chip carrier 104, wherein first chip 118 may be in electrically connection with first chip carrier 104.

According to another embodiment, at least one electrical interconnect 126 may be configured to electrically contact first chip 118 to second chip 122 via second chip carrier 112. At least one electrical interconnect 126 may be configured to electrically connect one or more contact pads, e.g. first chip first source/drain region 356, formed over first chip front side 348 to second chip carrier 112, wherein second chip 122 may be in electrically connection with second chip carrier 112.

At least one electrical interconnect 126 may include at least one from the following group of electrical interconnects, the group consisting of: wires, electrically conductive wires, bond wires, clips, electrically conductive clips, galvanically deposited interconnects.

At least one further electrical interconnect 327 may electrically connect first chip 118 to third chip 376, e.g. At least one further electrical interconnect 327 may electrically connect one or more contact pads 354, 356 formed over first chip top side 348 to one or more contact pads 3114 formed over third chip top side 378.

At least one electrical interconnect 126 may include portions of one or more electrical interconnects 3116 and first electrically conductive redistribution material 396. At least one further electrical interconnect 327 may include other portions of one or more electrical interconnects 3116 and first electrically conductive redistribution material 396.

In 390, restructuring may be carried out to selectively remove regions of at least one of first electrically conductive portions 396 and surface portions of one or more top side electrically conductive interconnects 3116 formed over top surface 3102 of electrically insulating material 124.

Optionally, restructuring of second electrically conductive redistribution material 398 and bottom side electrically conductive interconnects 3118 formed over bottom surface 3104 of electrically insulating material 124 may be carried out as well. Selective removal of the deposited metal layers including electrically conductive portions 396 and/or electrically conductive interconnects 3116 formed over top surface 3102 of electrically insulating material 124 may be carried out, e.g. by etching of deposited metal, e.g. by etching of galvanically deposited Cu for the device interconnect redistribution.

Selective removal may be carried out through a photoresist process. For example, photoresist may be deposited, e.g. laminated, over first electrically conductive redistribution material 396 and surface portions of one or more top side electrically conductive interconnects 3116. Optionally, this may be carried out for second electrically conductive redistribution material 398 and bottom side electrically conductive interconnects 3118 as well. Structuring of the photoresist may be carried out, e.g. using laser direct imaging LDI or a mask process with a mask aligner. Developing may be carried out such that one or more portions of the photoresist may be removed, such that one or more regions of first electrically conductive redistribution material 396 and one or more surface portions of one or more top side electrically conductive interconnects 3116 formed over top surface 3102 of electrically insulating material 124 may be exposed to structuring, while other regions may be protected from structuring. In case selective removal is carried out for second electrically conductive redistribution material 398 and bottom side electrically conductive interconnects 3118 as well, developing may be carried out such that one or more portions of the photoresist may be removed, such that one or more regions of second electrically conductive redistribution material 398 and one or more surface portions of one or more bottom side electrically conductive interconnects 3118 formed over bottom surface 3104 of electrically insulating material 124 may be exposed to structuring as well.

The structuring process may include etching, which may be used to remove one or more regions 3122 of first electrically conductive redistribution material 396 and/or one or more regions 3122 of one or more top side electrically conductive interconnects 3116.

A stripping process may be carried out remove any residue, and remaining photoresist. Therefore, one or more first electrically conductive portions 128 and one or more second electrically conductive portions 132 may be formed over electrically insulating material 124. One or more first electrically conductive portions 128 may include portions of first electrically conductive redistribution material 396 formed over top surface 3102 of electrically insulating material 124 as well as one or more top side electrically conductive interconnects 3116. One or more second electrically conductive portions 132 may include portions of second electrically conductive redistribution material 398 formed over bottom surface 3104 of electrically insulating material 124 and one or more bottom side electrically conductive interconnects 3118.

Forming one or more first electrically conductive portions 128 and one or more second electrically conductive portions 132 over electrically insulating material 124 may include forming one or more first electrically conductive portions 128 over and electrically contacting one or more first electrically conductive portions 128 to at least one of first chip carrier top side 106 and second chip carrier top side 114, and forming one or more second electrically conductive portions 132 over and electrically contacting one or more first electrically conductive portions 132 to at least one of first chip carrier bottom side 108 and second chip carrier bottom side 116.

One or more first electrically conductive portions 128 may be electrically contacted to and formed over at least one of first chip front side 348 and second chip front side 358. One or more first electrically conductive portions 128 may be electrically contacted to and formed over at least one of: one or more contact pads, e.g. 354, 356 formed over first chip front side, and one or more contact pads, 364, 366, formed over second chip front side.

One or more first electrically conductive portions 128 may be formed over at least one of first chip carrier top side 106 and second chip carrier top side 114. One or more first electrically conductive portions 128 may be formed over at least one of first chip top side 348, second chip top side 358 and third chip top side 378.

One or more first electrically conductive portions 128 may electrically connect first electrically conductive redistribution material 396 to one or more contact pads formed over first chip top side 348, e.g. One or more first electrically conductive portions 128 may electrically connect first electrically conductive redistribution material 396 to first chip first source/drain contact region 356, e.g. One or more first electrically conductive portions 128 may electrically connect first electrically conductive redistribution material 396 to first chip gate contact region 354.

One or more first electrically conductive portions 128 may electrically connect electrically conductive portion 396 to one or more contact pads formed over second chip top side 358, e.g. One or more first electrically conductive portions 128 may electrically connect first electrically conductive redistribution material 396 to second chip first source/drain contact region 366, e.g. One or more first electrically conductive portions 128 may electrically connect first electrically conductive redistribution material 396 to second chip gate contact region 364.

One or more first electrically conductive portions 128 may electrically connect first electrically conductive redistribution material 396 to one or more contact pads 3114 formed over third chip top side 378.

One or more first electrically conductive portions 128 may electrically connect first electrically conductive redistribution material 396 to first chip carrier top side 106. One or more first electrically conductive portions 128 may electrically connect first electrically conductive redistribution material 396 to second chip carrier top side 114.

One or more second electrically conductive portions 132 may be formed over at least one of first chip carrier bottom side 108 and second chip carrier bottom side 116. One or more second electrically conductive portions 132 may electrically connect at least one of first chip bottom side 352, second chip bottom side 362 and third chip bottom side 382.

One or more second electrically conductive portions 132 may electrically connect second electrically conductive redistribution material 398 to first chip carrier bottom side 108. One or more second electrically conductive portions 132 may electrically connect second electrically conductive redistribution material 398 to second chip carrier bottom side 116.

It may be understood that each of one or more first electrically conductive portions 128 may be electrically insulated from each other by electrically insulating material 124, or electrically connected to each through or over electrically insulating material 124 depending on the electrical circuitry design of the device package. Each of one or more second electrically conductive portions 132 may be electrically insulated from each other by electrically insulating material 124, or electrically connected to each through or over electrically insulating material 124 depending on the electrical circuitry design of the device package.

Figure 4A:
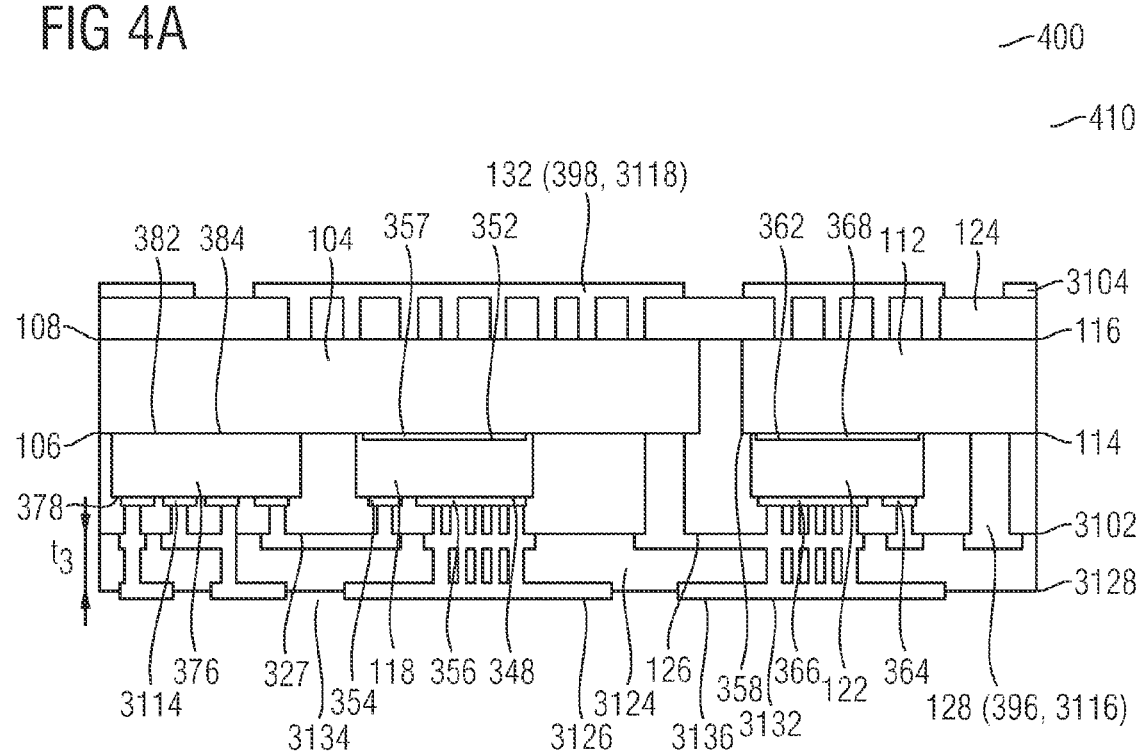
FIGS. 4A to 4C show a method for forming a chip arrangement according to an embodiment.
Figure 4B:
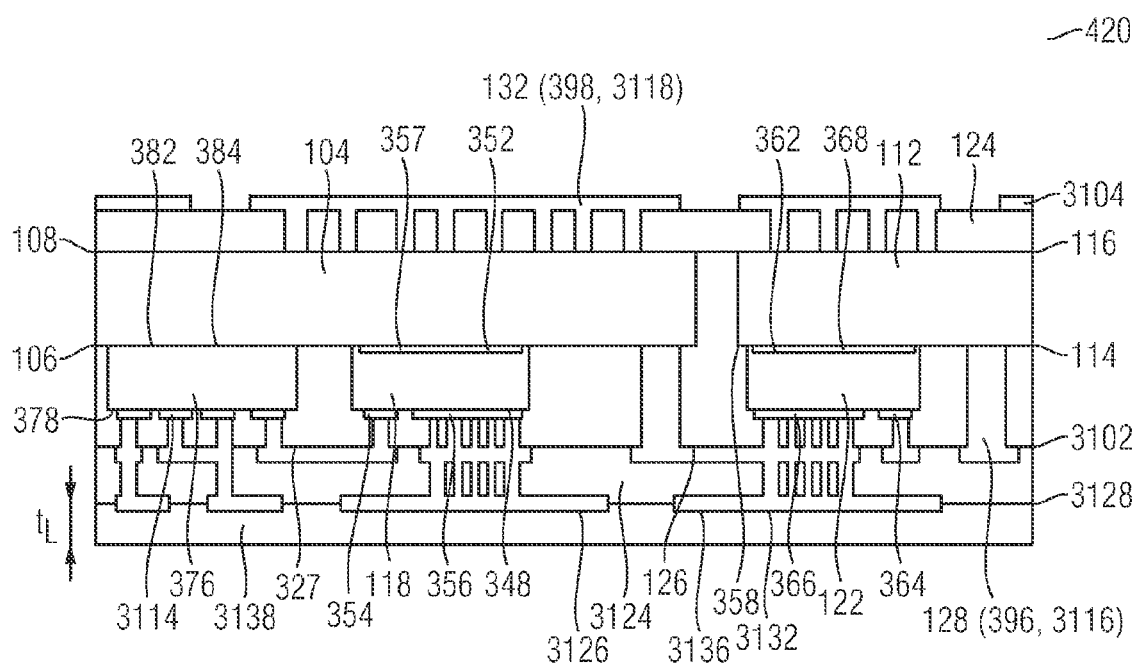
Figure 4C:
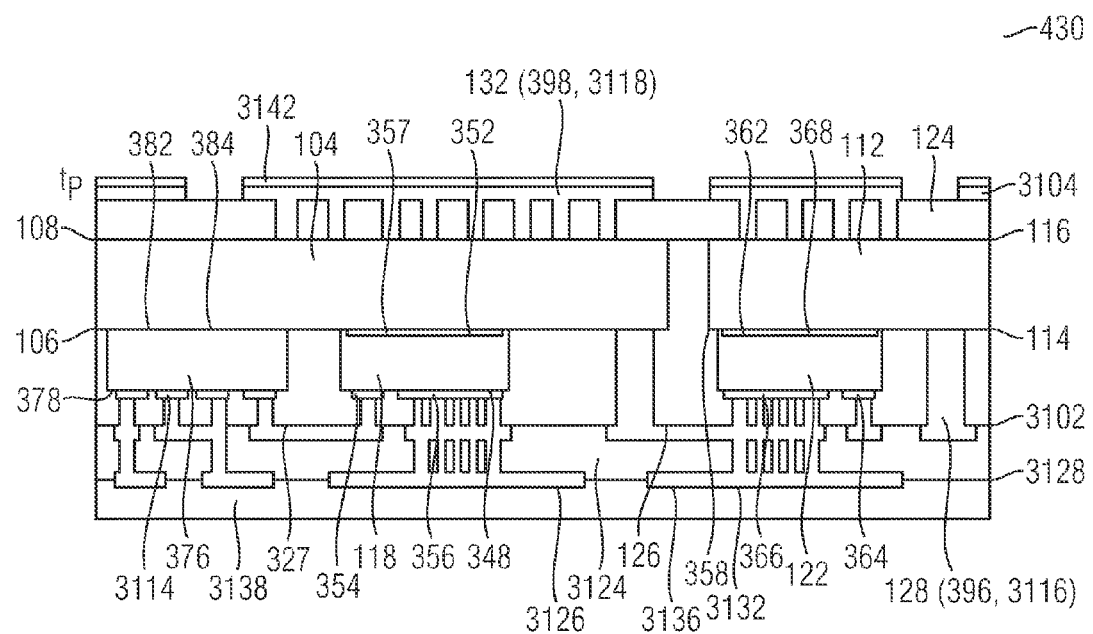

FIGS. 4A to 4C show a method for forming a chip arrangement according to an embodiment. Method 400 may include one or more or all of the processes already described with respect to at least one of method 200 and method 300. Method 400 may include one or more or all of the features described with respect to processes 310 to 390.

According to an embodiment, method 400 may include processes 310 to 390. In addition, method 400 may further include processes 410 to 430.

In 410, an additional redistribution layer may be formed over at least one side of the package for device interconnection. Process 410 may include deposition of further electrically insulating material 3124 and third electrically conductive redistribution material 3126 and footprint structuring.

Further electrically insulating material 3124 may be deposited to at least partially surround one or more first electrically conductive portions 128. For example, further electrically insulating material 3124 may be deposited to at least partially surround first electrically conductive redistribution material 396. Further electrically insulating material 3124 may be deposited over electrically insulating material 124. Further electrically insulating material 3124 may be deposited over top surface 3102 of electrically insulating material 124. Further electrically insulating material 3124 may be deposited over at least one of first chip carrier top side 106 and second chip carrier top side 114.

Further electrically insulating material 3124 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Electrically insulating material 124 and further electrically insulating material 3124 may include the same or different materials.

Further electrically insulating material 3124 deposited over at least one of first chip carrier top side 106 and second chip carrier top side 114 may have a thickness t3 ranging from about 5 μm to about 500 μm, e.g. about 15 μm to about 150 μm.

Third electrically conductive redistribution material 3126 may be deposited over further electrically insulating material 3124. Third electrically conductive redistribution material 3126 may be deposited over at least one of first chip carrier top side 106 and second chip carrier top side 114.

Third electrically conductive redistribution material 3126 may be disposed over a surface of further electrically insulating material 3124, e.g. over top surface 3128 of further electrically insulating material 3124, wherein top surface 3128 may be arranged over at least one of first chip carrier top side 106 and second chip carrier top side 114.

Top surface 3128 of further electrically insulating material 3124 may face a same direction as top surface 3102 of electrically insulating material 124.

Third electrically conductive redistribution material 3126 may include an electrically conductive foil, e.g. a metal foil, e.g. a copper foil. Third electrically conductive redistribution material 3126 may include an electrically conductive layer having a thickness ranging from about 5 μm to about 50 μm, e.g. about 10 μm to about 30 μm, e.g. about 15 μm to about 25 μm.

Third electrically conductive redistribution material 3126 may be pressed onto electrically insulating material, e.g. third electrically conductive redistribution material 3126 may be pressed onto further electrically insulating material 3124, e.g. onto top surface 3128 of further electrically insulating material 3124.

Structuring of third electrically conductive redistribution material 3126 may be carried out for subsequent via formation and via filling processes. A photoresist process may be carried out. For example, photoresist may be deposited, e.g. laminated over third electrically conductive redistribution material 3126. Structuring of the photoresist may be carried out, e.g. using laser direct imaging LDI or a mask process with a mask aligner. Developing may be carried out such that one or more portions of the photoresist may be removed, and one or more regions of third electrically conductive redistribution material 3126 may be exposed to structuring, and one or more other regions of third electrically conductive redistribution material 3126 may be protected from structuring. The structuring process may include etching, which may be used to remove one or more regions of third electrically conductive redistribution material 3126 which were exposed to structuring. A stripping process may be carried out remove any residue, and remaining photoresist. The removed one or more regions of third electrically conductive redistribution material 3126 may expose one or more regions of further electrically insulating material 3124 to restructuring.

Laser drilling of further electrically insulating material 3124 may be carried out. One or more regions of further electrically insulating material 3124, exposed as a result of the removal of one or more regions of third electrically conductive redistribution material 3126, may be restructured, e.g. by using a drilling process, e.g. laser drilling. The laser drilling may be carried out, e.g. using a laser, e.g. a CO2 laser. Laser drilling may be carried out to produce one or more further vias, i.e. holes.

One or more further top side vias may be formed over at least one of first chip carrier top side 106 and second chip carrier top side 114. One or more further top side vias may be formed over at least one of first chip top side 348, second chip top side 358 and third chip top side 378.

One or more further top side vias may include one or more channels from third electrically conductive redistribution material 3126 to one or more first electrically conductive portions 128, e.g. One or more further top side vias may include one or more channels from third electrically conductive redistribution material 3126 to first electrically conductive redistribution material 396, wherein first electrically conductive redistribution material 396 may be electrically contacted to first chip first source/drain contact region 356, e.g. One or more further top side vias may include one or more channels from third electrically conductive redistribution material 3126 to first electrically conductive redistribution material 396, wherein first electrically conductive redistribution material 396 may be electrically contacted to first chip gate contact region 354.

One or more further top side vias may include one or more channels from third electrically conductive redistribution material 3126 to first electrically conductive redistribution material 396, wherein first electrically conductive redistribution material 396 may be electrically contacted to one or more contact pads formed over second chip top side 358, e.g. One or more further top side vias may include one or more channels from third electrically conductive redistribution material 3126 to first electrically conductive redistribution material 396, wherein first electrically conductive redistribution material 396 may be electrically contacted to second chip first source/drain contact region 366, e.g. One or more further top side vias may include one or more channels from third electrically conductive redistribution material 3126 to first electrically conductive redistribution material 396, wherein first electrically conductive redistribution material 396 may be electrically contacted to second chip gate contact region 364.

One or more further top side vias may include one or more channels from third electrically conductive redistribution material 3126 to first electrically conductive redistribution material 396, wherein first electrically conductive redistribution material 396 may be electrically contacted to one or more contact pads 3114 formed over third chip top side 378.

One or more further top side vias may include one or more channels from third electrically conductive redistribution material 3126 to first electrically conductive redistribution material 396, wherein first electrically conductive redistribution material 396 may be electrically contacted to first chip carrier top side 106. One or more further top side vias may include one or more channels from third electrically conductive redistribution material 3126 to first electrically conductive redistribution material 396, wherein first electrically conductive redistribution material 396 may be electrically contacted to second chip carrier top side 114.

Via filling may be carried out to provide contact metallization. One or more further top side electrical interconnects 3132 may be deposited to fill one or more further top side vias. At least one of one or more further top side electrical interconnects 3132 may include at least one from the following group of materials, the group of materials consisting of: copper, nickel, iron, copper alloy, nickel alloy, iron alloy. During via filling process, the top and bottom Cu layer 396 and 398 may be increased to such that a thickness ranging from about 10 μm to about 200 μm, e.g. from about 20 μm to about 150 μm, may be attained.

Chemical activation and/or galvanic deposition may be carried out to provide metallization of the vias for the interconnects. A desmear and/or cleaning process may be carried out, wherein the surfaces of one or more further top side vias may be prepared for plating. An activation process may be carried out wherein an enabling layer may be deposited to enable plating of the side walls of one or more further top side vias. Enabling layer may include an electrically conductive layer, e.g. conductive organic layer or Pd layer. Subsequently, a plating process may be carried out and electrically conductive material forming one or more electrically conductive interconnects may be deposited into one or more further top side vias.

One or more further top side electrical interconnects 3132 may electrically connect third electrically conductive redistribution material 3126 to one or more first electrically conductive portions 128, e.g. One or more further top side electrical interconnects 3132 may electrically connect third electrically conductive redistribution material 3126 to first electrically conductive redistribution material 396, wherein first electrically conductive redistribution material 396 may be electrically contacted to first chip first source/drain contact region 356, e.g. One or more further top side electrical interconnects 3132 may electrically connect third electrically conductive redistribution material 3126 to first electrically conductive redistribution material 396, wherein first electrically conductive redistribution material 396 may be electrically contacted to first chip gate contact region 354.

One or more further top side electrical interconnects 3132 may electrically connect third electrically conductive redistribution material 3126 to first electrically conductive redistribution material 396, wherein first electrically conductive redistribution material 396 may be electrically contacted to one or more contact pads formed over second chip top side 358, e.g. One or more further top side electrical interconnects 3132 may electrically connect third electrically conductive redistribution material 3126 to first electrically conductive redistribution material 396, wherein first electrically conductive redistribution material 396 may be electrically contacted to second chip first source/drain contact region 366, e.g. One or more further top side electrical interconnects 3132 may electrically connect third electrically conductive redistribution material 3126 to first electrically conductive redistribution material 396, wherein first electrically conductive redistribution material 396 may be electrically contacted to second chip gate contact region 364.

One or more further top side electrical interconnects 3132 may electrically connect third electrically conductive redistribution material 3126 to first electrically conductive redistribution material 396, wherein first electrically conductive redistribution material 396 may be electrically contacted to one or more contact pads 3114 formed over third chip top side 378.

One or more further top side electrical interconnects 3132 may electrically connect third electrically conductive redistribution material 3126 to first electrically conductive redistribution material 396, wherein first electrically conductive redistribution material 396 may be electrically contacted to first chip carrier top side 106. One or more further top side electrical interconnects 3132 may electrically connect third electrically conductive redistribution material 3126 to first electrically conductive redistribution material 396, wherein first electrically conductive redistribution material 396 may be electrically contacted to second chip carrier top side 114.

Restructuring may be carried out to selectively remove regions of at least one of third electrically conductive redistribution material 3126 and/or one or more further top side electrical interconnects 3132 formed over top surface 3128 of further electrically insulating material 3124.

Optionally, restructuring of second electrically conductive redistribution material 398 and bottom side electrically conductive interconnects 3118 may be carried out as well, e.g. as a parallel process, if not carried out yet carried out in process 390.

Selective removal of the deposited metal layers over top surface 3128 of further electrically insulating material 3124 may be carried out. Selective removal may include the selective removal of third electrically conductive redistribution material 3126 and one or more further top side electrical interconnects 3132 e.g. by etching of deposited metal, e.g. by etching of galvanically deposited Cu for the device interconnect redistribution.

Selective removal may be carried out through a photoresist process. For example, photoresist may be deposited, e.g. laminated, over third electrically conductive redistribution material 3126 and surface portions of one or more further top side electrical interconnects 3132. In other words, photoresist may be deposited over top surface 3128 of further electrically insulating material 3124. Structuring of the photoresist may be carried out, e.g. using laser direct imaging LDI or a mask process with a mask aligner. Developing may be carried out such that one or more portions of the photoresist may be removed, such that one or more regions of third electrically conductive redistribution material 3126 formed over top surface 3128 of further electrically insulating material 3124, and/or one or more surface portions of one or more further top side electrical interconnects 3132 formed over top surface 3128 of further electrically insulating material 3124, may be exposed to structuring, while other regions may be protected from structuring. The structuring process may include etching, which may be used to remove one or more regions 3134 of third electrically conductive redistribution material 3126 formed over top surface 3128 of further electrically insulating material 3124, and/or one or more surface portions 3134 of one or more further top side electrical interconnects 3132 formed over top surface 3128 of further electrically insulating material 3124.

A stripping process may be carried out remove any residue, and remaining photoresist. Therefore, one or more third electrically conductive portions 3136 may be formed over electrically insulating material 124, and further electrically insulating material 3124. One or more third electrically conductive portions 3136 may include portions of third electrically conductive redistribution material 3126 and one or more further top side electrical interconnects 3132.

One or more third electrically conductive portions 3136 may be electrically connected to one or more first electrically conductive portions 128, e.g. One or more third electrically conductive portions 3136 may be electrically connected to first electrically conductive redistribution material 396, wherein first electrically conductive redistribution material 396 may be electrically contacted to first chip first source/drain contact region 356, e.g. One or more third electrically conductive portions 3136 may be electrically connected to first electrically conductive redistribution material 396, wherein first electrically conductive redistribution material 396 may be electrically contacted to first chip gate contact region 354.

One or more third electrically conductive portions 3136 may be electrically connected to first electrically conductive redistribution material 396, wherein first electrically conductive redistribution material 396 may be electrically contacted to one or more contact pads formed over second chip top side 358, e.g. One or more third electrically conductive portions 3136 may be electrically connected to first electrically conductive redistribution material 396, wherein first electrically conductive redistribution material 396 may be electrically contacted to second chip first source/drain contact region 366, e.g. One or more third electrically conductive portions 3136 may be electrically connected to first electrically conductive redistribution material 396, wherein first electrically conductive redistribution material 396 may be electrically contacted to second chip gate contact region 364.

One or more third electrically conductive portions 3136 may be electrically connected to first electrically conductive redistribution material 396, wherein first electrically conductive redistribution material 396 may be electrically contacted to one or more contact pads 3114 formed over third chip top side 378.

One or more third electrically conductive portions 3136 may be electrically connected to first electrically conductive redistribution material 396, wherein first electrically conductive redistribution material 396 may be electrically contacted to first chip carrier top side 106. One or more third electrically conductive portions 3136 may be electrically connected to first electrically conductive redistribution material 396, wherein first electrically conductive redistribution material 396 may be electrically contacted to second chip carrier top side 114.

One or more third electrically conductive portions 3136 may be formed over further electrically insulating material 3124, wherein one or more third electrically conductive portions 3136 may be formed over and electrically contacted to at least one of first chip carrier top side 106 and second chip carrier top side 114.

Therefore, one or more third electrically conductive portions 3136 may include portions of third electrically conductive redistribution material 3136 formed over top surface 3128 of further electrically insulating material 3124 as well as one or more further top side electrically conductive interconnects 3132.

One or more third electrically conductive portions 3136 may be electrically contacted to and formed over at least one of first chip front side 348 and second chip front side 358.

One or more third electrically conductive portions 3136 may be electrically contacted to one or more first electrically conductive portions 128 through further electrically insulating material 3124.

Each of one or more third electrically conductive portions 3136 may be electrically insulated from each other by further electrically insulating material 3124, or electrically connected to each through or over electrically insulating material 3124 depending on the electrical circuitry design of the device package.

At least one electrical interconnect 126 and at least one further electrical interconnect 327 may be electrically insulated from each other by at least one of electrically insulating material 124 and further electrically insulating material 3124.

In 420, lamination layer 3138 may be formed over top surface 3128 of further electrically insulating material 3124. Lamination layer 3138 may be formed over one or more third electrically conductive portions 3136. Lamination layer 3138 may provide electrical insulation for the device. Lamination layer 3138 may have a thickness $t_L$ ranging from about 5 μm to about 500 μm, e.g. from about 15 μm to about 150 μm. Lamination layer 3138 may include at least one from the following group of materials, the group consisting of: epoxy, solder resist, varnish.

In 430, a plating process may be carried out. Plating layer 3142 may be formed over one or more second electrically conductive portions 132, e.g. second electrically conductive redistribution material 398 deposited over bottom surface 3104 of electrically insulating material 124. Plating layer 3142 may include an electrically conductive layer. Plating layer 3142 may include at least one from the following materials, the group consisting of: nickel gold, palladium, nickel-gold NiAu, nickel-palladium NiPd, nickel-palladium-gold, NiPdAu. Plating layer 3142 may be deposited by plating, wherein plating layer 3142 may have a thickness tP ranging from about 100 nm to about 50 μm, e.g. from about 1 μm to about 10 µm. Plating may be deposited on the exposed second electrically conductive portions 132 for subsequent soldering onto a printed circuit board PCB, wherein the PCB may include a metal foil, e.g. a Cu foil.

Figure 5:
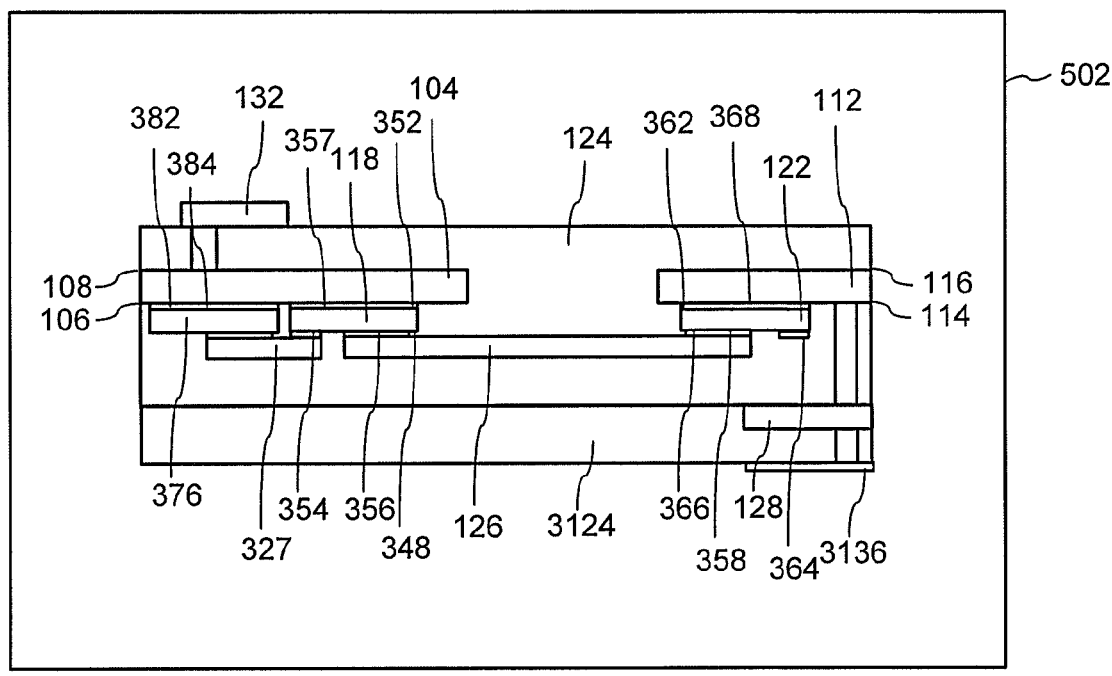
FIG. 5 shows a chip arrangement according to an embodiment.

FIG. 5 shows chip arrangement 502 according to an embodiment.

Chip arrangement 502, e.g. a chip package, may include first chip carrier 104, wherein first chip carrier 104 may include first chip carrier top side 106 and first chip carrier bottom side 108. Chip arrangement 502 may include second chip carrier 112, wherein second chip carrier 112 may include second chip carrier top side 114 and second chip carrier bottom side 116. Chip arrangement 502 may include first chip 118, e.g. a semiconductor chip, e.g. a semiconductor die, electrically connected to first chip carrier top side 106, and second chip 122 electrically connected to second chip carrier top side 114. Chip arrangement 502 may include electrically insulating material 124 configured to at least partially surround first chip carrier 104 and second chip carrier 106. Chip arrangement 502 may include at least one electrical interconnect 126 configured to electrically contact first chip 118 to second chip 122 through electrically insulating material 124. Chip arrangement 502 may include one or more first electrically conductive portions 128 and one or more second electrically conductive portions 132 formed over electrically insulating material 124, wherein one or more first electrically conductive portions 128 may be formed over and electrically contacted to at least one of first chip carrier top side 106 and second chip carrier top side 114, and wherein one or more second electrically conductive portions 132 may be formed over and electrically contacted to at least one of first chip carrier bottom side 108 and second chip carrier bottom side 116.

First chip 118 and second chip 122 may each include a power semiconductor chip. A power semiconductor chip may include at least one power semiconductor device from the group of power semiconductor devices, the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

First chip 118 may be electrically connected to first chip carrier top side 106 via at least one contact pad 357, formed over a first chip back side 352. Second chip 122 may be electrically connected to second chip carrier top side 114 via at least one contact pad 368 formed over second chip back side 362.

Chip arrangement 502 may further include third chip 376 disposed over and electrically insulated from first chip carrier 104, and electrically connected to first chip 118 via at least one further electrical interconnect 327.

Third chip 376 may include a semiconductor logic chip. A semiconductor logic chip includes at least one semiconductor logic device from the group of semiconductor logic devices, the group consisting of: an application specific integrated circuit ASIC, a driver, a controller, a sensor, a memory.

Third chip back side 382 may be disposed over first chip carrier 104.

Third chip 376 may be electrically insulated from first chip carrier 104 by an electrically insulating medium 384. Electrically insulating medium 384 may include at least one from the following group of materials, the group consisting of: an adhesive, an electrically insulating adhesive, an epoxy, glue, a paste, an adhesive foil.

First chip carrier 104 may include a first lead frame carrier. Second chip carrier 112 may include a second lead frame carrier.

At least one of first chip carrier 104 and second chip carrier 112 may include at least one from the following group of materials, the group of materials consisting of: copper, nickel, iron, copper alloy, nickel alloy, iron alloy.

Electrically insulating material 124 may be further configured to at least partially surround first chip 118 and second chip 122.

Electrically insulating material 124 may be further configured to electrically insulate first chip 118 and first chip carrier 104 from second chip 122 and second chip carrier 112.

Electrically insulating material 124 may be formed over first and second chip carrier top sides 106, 114, and first and second chip carrier bottom sides 108, 116.

At least one electrical interconnect 126 may be configured to electrically contact first chip 118 to second chip 122 via first chip carrier 104.

At least one electrical interconnect 126 may be configured to electrically connect one or more contact pads 364, 366 formed over second chip front side 358 to first chip carrier 104.

At least one electrical interconnect 126 may include at least one from the following group of electrical interconnects, the group consisting of: wires, electrically conductive wires, bond wires, clips, electrically conductive clips, galvanically deposited interconnects.

One or more first electrically conductive portions 128 may be electrically contacted to and formed over at least one of first chip front side 348 and second chip front side 358.

One or more first electrically conductive portions 128 may be electrically contacted to and formed over at least one of: one or more contact pads 354, 356 formed over first chip front side 348, and one or more contact pads 364, 366 formed over second chip front side 358.

Chip arrangement 502 may further include further electrically insulating material 3124 configured to at least partially surround one or more first electrically conductive portions 128.

Chip arrangement 502 may further include one or more third electrically conductive portions 3136 formed over further electrically insulating material 3124, wherein one or more third electrically conductive portions 3136 may be formed over and electrically contacted to at least one of first chip carrier top side 106 and second chip carrier top side 114.

One or more third electrically conductive portions 3136 may be electrically contacted to and formed over at least one of first chip front side 348 and second chip front side 358.

One or more third electrically conductive portions 3136 may be electrically contacted to one or more first electrically conductive portions 128 through further electrically insulating material 3124.

At least one of electrically insulating material 124 and further electrically insulating material 3124 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles, e.g. glass fibers, glass particles and nanoparticles.

Various embodiments provide one or more processes for forming a chip arrangement, wherein processes may also be used for PCB manufacturing.

Various embodiments provide a multi-chip package with increased and therefore higher integration density.

Various embodiments provide a modular package with excellent thermal and electrical device performance Various embodiments provide a simplified manufacturing process for forming a multi-chip arrangement.

Various embodiments provide a process for forming a chip arrangement wherein parallel, i.e. batch device manufacturing may be implemented.

Various embodiments provide a chip arrangement including: a first chip carrier including a first chip carrier top side and a first chip carrier bottom side; a second chip carrier including a second chip carrier top side and a second chip carrier bottom side; a first chip electrically connected to the first chip carrier top side; a second chip electrically connected to the second chip carrier top side; an electrically insulating material configured to at least partially surround the first chip carrier and the second chip carrier; at least one electrical interconnect configured to electrically contact the first chip to the second chip through the electrically insulating material; and one or more first electrically conductive portions and one or more second electrically conductive portions formed over the electrically insulating material, wherein the one or more first electrically conductive portions are formed over and electrically contacted to at least one of the first chip carrier top side and second chip carrier top side, and wherein the one or more second electrically conductive portions are formed over and electrically contacted to at least one of the first chip carrier bottom side and second chip carrier bottom side.

According to an embodiment, the first chip and the second chip each includes a power semiconductor chip.

According to an embodiment, the power semiconductor chip includes at least one power semiconductor device from the group of power semiconductor devices, the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the first chip is electrically connected to the first chip carrier top side via at least one contact pad formed over a first chip back side; and wherein the second chip is electrically connected to the second chip carrier top side via at least one contact pad formed over a second chip back side.

According to an embodiment, the chip arrangement further includes a third chip disposed over and electrically insulated from the first chip carrier, and electrically connected to the first chip via at least one further electrical interconnect.

According to an embodiment, the chip arrangement further includes at least one other further electrical interconnect configured to electrically connect the third chip to the second chip.

According to an embodiment, the third chip includes a semiconductor logic chip.

According to an embodiment, the semiconductor logic chip includes at least one semiconductor logic device from the group of semiconductor logic devices, the group consisting of: an application specific integrated circuit ASIC, a driver, a controller, a sensor, a memory.

According to an embodiment, the third chip back side is disposed over the first chip carrier.

According to an embodiment, the third chip is electrically insulated from the first chip carrier by an electrically insulating medium, the electrically insulating medium including at least one from the following group of materials, the group consisting of: an adhesive, an electrically insulating adhesive, an epoxy, glue, a paste, an adhesive foil, an electrically insulating organic wafer backside coating.

According to an embodiment, the first chip carrier includes a first lead frame carrier; and the second chip carrier includes a second lead frame carrier.

According to an embodiment, at least one of the first chip carrier and the second chip carrier includes at least one from the following group of materials, the group of materials consisting of: copper, nickel, iron, copper alloy, nickel alloy, iron alloy.

According to an embodiment, the electrically insulating material is further configured to at least partially surround the first chip and the second chip.

According to an embodiment, the electrically insulating material is further configured to electrically insulate the first chip and the first chip carrier from the second chip and the second chip carrier.

According to an embodiment, the electrically insulating material is formed over the first and the second chip carrier top sides, and the first and the second chip carrier bottom sides.

According to an embodiment, the at least one electrical interconnect is configured to electrically contact the first chip to the second chip via the first chip carrier.

According to an embodiment, the at least one electrical interconnect is configured to electrically connect one or more contact pads formed over a second chip front side to first chip carrier.

According to an embodiment, the at least one electrical interconnect includes at least one from the following group of electrical interconnects, the group consisting of: wires, electrically conductive wires, bond wires, clips, electrically conductive clips, galvanically deposited interconnects.

According to an embodiment, the one or more first electrically conductive portions are electrically contacted to and formed over at least one of a first chip front side and a second chip front side.

According to an embodiment, the one or more first electrically conductive portions are electrically contacted to and formed over at least one of: one or more contact pads formed over a first chip front side, and one or more contact pads formed over a second chip front side.

According to an embodiment, the chip arrangement further includes a further electrically insulating material configured to at least partially surround one or more first electrically conductive portions.

According to an embodiment, chip arrangement further includes one or more third electrically conductive portions formed over the further electrically insulating material, wherein the one or more third electrically conductive portions are formed over and electrically contacted to at least one of the first chip carrier top side and the second chip carrier top side.

According to an embodiment, the one or more third electrically conductive portions are electrically contacted to and formed over at least one of a first chip front side and a second chip front side.

According to an embodiment, the one or more third electrically conductive portions are electrically contacted to one or more first electrically conductive portions through the further electrically insulating material.

According to an embodiment, the electrically insulating material includes at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, chip arrangement further includes an electrically conductive plating layer formed over the one or more second electrically conductive portions.

Various embodiments provide a method for forming a chip arrangement, the method including: electrically connecting a first chip to a first chip carrier top side, wherein the first chip carrier includes a first chip carrier top side and a first chip carrier bottom side; electrically connecting a second chip to a second chip carrier top side, wherein the second chip carrier includes a second chip carrier top side and a second chip carrier bottom side; at least partially surrounding the first chip carrier and the second chip carrier with an electrically insulating material; forming at least one electrical interconnect to electrically contact the first chip to the second chip through the electrically insulating material; forming one or more first electrically conductive portions and one or more second electrically conductive portions over the electrically insulating material, wherein forming one or more first electrically conductive portions and one or more second electrically conductive portions over the electrically insulating material includes forming the one or more first electrically conductive portions over and electrically contacting the one or more first electrically conductive portions to at least one of the first chip carrier top side and second chip carrier top side, and forming the one or more second electrically conductive portions over and electrically contacting the one or more first electrically conductive portions to at least one of the first chip carrier bottom side and second chip carrier bottom side.

According to an embodiment, the method further includes disposing a third chip and electrically insulating the third chip from the first chip carrier, and electrically connecting the third chip to the first chip via at least one further electrical interconnect; and further forming at least one other further electrical interconnect to electrically contact the third chip to the second chip through the electrically insulating material.

According to an embodiment, the method further includes forming one or more first electrically conductive portions and one or more second electrically conductive portions includes forming one or more first electrically conductive portions and one or more second electrically conductive portions by galvanic deposition; and depositing an electrically conductive plating layer over the one or more second electrically conductive portions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement comprising:
   a first chip carrier comprising a first chip carrier top side and a first chip carrier bottom side;
   a second chip carrier comprising a second chip carrier top side and a second chip carrier bottom side;
   a first chip electrically connected to the first chip carrier top side; a second chip electrically connected to the second chip carrier top side;
   an electrically insulating material configured to at least partially surround the first chip carrier and the second chip carrier;
   at least one electrical interconnect configured to electrically contact the first chip to the second chip through the electrically insulating material; and
   one or more first electrically conductive portions and one or more second electrically conductive portions formed over the electrically insulating material, wherein the one or more first electrically conductive portions are formed over and electrically contacted to at least one of the first chip carrier top side and second chip carrier top side, and wherein the one or more second electrically conductive portions are formed over and electrically contacted to at least one of the first chip carrier bottom side and second chip carrier bottom side;
   wherein the first chip is electrically connected to the first chip carrier top side via at least one contact pad formed over a first chip back side; and
   wherein the second chip is electrically connected to the second chip carrier top side via at least one contact pad formed over a second chip back side.

2. The chip arrangement according to claim 1,
   wherein the first chip and the second chip each comprises a power semiconductor chip.

3. The chip arrangement according to claim 2,
   wherein the power semiconductor chip comprises at least one power semiconductor device from the group of power semiconductor devices, the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

4. The chip arrangement according to claim 1, further comprising
   a third chip disposed over and electrically insulated from the first chip carrier, and electrically connected to the first chip via at least one further electrical interconnect.

5. The chip arrangement according to claim 4, further comprising
   at least one other further electrical interconnect configured to electrically connect the third chip to the second chip.

6. The chip arrangement according to claim 4,
   wherein the third chip comprises a semiconductor logic chip.

7. The chip arrangement according to claim 6,
   wherein the semiconductor logic chip comprises at least one semiconductor logic device from the group of semiconductor logic devices, the group consisting of: an application specific integrated circuit ASIC, a driver, a controller, a sensor, a memory.

8. The chip arrangement according to claim 4,
   wherein the third chip back side is disposed over the first chip carrier.

9. The chip arrangement according to claim 4,
   wherein the third chip is electrically insulated from the first chip carrier by an electrically insulating medium, the electrically insulating medium comprising at least one from the following group of materials, the group consisting of: an adhesive, an electrically insulating adhesive, an epoxy, glue, a paste, an adhesive foil, an electrically insulating organic wafer backside coating.

10. The chip arrangement according to claim 1,
    wherein the first chip carrier comprises a first lead frame carrier; and
    wherein the second chip carrier comprises a second lead frame carrier.

11. The chip arrangement according to claim 1,
    wherein at least one of the first chip carrier and the second chip carrier comprises at least one from the following group of materials, the group of materials consisting of: copper, nickel, iron, copper alloy, nickel alloy, iron alloy.

12. The chip arrangement according to claim 1, wherein the electrically insulating material is further configured to at least partially surround the first chip and the second chip.

13. The chip arrangement according to claim 1, wherein the electrically insulating material is further configured to electrically insulate the first chip and the first chip carrier from the second chip and the second chip carrier.

14. The chip arrangement according to claim 1, wherein the electrically insulating material is formed over the first and the second chip carrier top sides, and the first and the second chip carrier bottom sides.

15. The chip arrangement according to claim 1, wherein the at least one electrical interconnect is configured to electrically contact the first chip to the second chip via the first chip carrier.

16. The chip arrangement according to claim 1, wherein the at least one electrical interconnect is configured to electrically connect one or more contact pads formed over a second chip front side to first chip carrier.

17. The chip arrangement according to claim 1, wherein the at least one electrical interconnect comprises at least one from the following group of electrical interconnects, the group consisting of: wires, electrically conductive wires, bond wires, clips, electrically conductive clips, galvanically deposited interconnects.

18. The chip arrangement according to claim 1, wherein the one or more first electrically conductive portions are electrically contacted to and formed over at least one of a first chip front side and a second chip front side.

19. The chip arrangement according to claim 17, wherein the one or more first electrically conductive portions are electrically contacted to and formed over at least one of: one or more contact pads formed over a first chip front side, and one or more contact pads formed over a second chip front side.

20. A chip arrangement comprising:
a first chip carrier comprising a first chip carrier top side and a first chip carrier bottom side; a second chip carrier comprising a second chip carrier top side and a second chip carrier bottom side; a first chip electrically connected to the first chip carrier top side; a second chip electrically connected to the second chip carrier top side; an electrically insulating material configured to at least partially surround the first chip carrier and the second chip carrier; at least one electrical interconnect configured to electrically contact the first chip to the second chip through the electrically insulating material; and one or more first electrically conductive portions and one or more second electrically conductive portions formed over the electrically insulating material, wherein the one or more first electrically conductive portions are formed over and electrically contacted to at least one of the first chip carrier top side and second chip carrier top side, and wherein the one or more second electrically conductive portions are formed over and electrically contacted to at least one of the first chip carrier bottom side and second chip carrier bottom side;
a further electrically insulating material configured to at least partially surround the one or more first electrically conductive portions,
one or more third electrically conductive portions formed over the further electrically insulating material,
wherein the one or more third electrically conductive portions are formed over and electrically contacted to at least one of the first chip carrier top side and the second chip carrier top side.

21. The chip arrangement according to claim 20, wherein the one or more third electrically conductive portions are electrically contacted to and formed over at least one of a first chip front side and a second chip front side.

22. The chip arrangement according to claim 20, wherein the one or more third electrically conductive portions are electrically contacted to one or more first electrically conductive portions through the further electrically insulating material.

23. The chip arrangement according to claim 1, wherein the electrically insulating material comprises at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

24. The chip arrangement according to claim 1, further comprising
an electrically conductive plating layer formed over the one or more second electrically conductive portions.

25. A method for forming a chip arrangement, the method comprising: electrically connecting a first chip to a first chip carrier top side, wherein the first chip carrier comprises a first chip carrier top side and a first chip carrier bottom side; electrically connecting a second chip to a second chip carrier top side, wherein the second chip carrier comprises a second chip carrier top side and a second chip carrier bottom side; at least partially surrounding the first chip carrier and the second chip carrier with an electrically insulating material;
forming at least one electrical interconnect to electrically contact the first chip to the second chip through the electrically insulating material; forming one or more first electrically conductive portions and one or more second electrically conductive portions over the electrically insulating material, wherein forming one or more first electrically conductive portions and one or more second electrically conductive portions over the electrically insulating material comprises
forming the one or more first electrically conductive portions over and electrically contacting the one or more first electrically conductive portions to at least one of the first chip carrier top side and second chip carrier top side, and
forming the one or more second electrically conductive portions over and electrically contacting the one or more first electrically conductive portions to at least one of the first chip carrier bottom side and second chip carrier bottom side;
disposing a third chip and electrically insulating the third chip from the first chip carrier, and electrically connecting the third chip to the first chip via at least one further electrical interconnect; and further forming at least one other further electrical interconnect to electrically contact the third chip to the second chip through the electrically insulating material.

26. The method according to claim 25, further comprising forming one or more first electrically conductive portions and one or more second electrically conductive portions comprises forming one or more first electrically conductive portions and one or more second electrically conductive portions by galvanic deposition; and
depositing an electrically conductive plating layer over the one or more second electrically conductive portions.

* * * * *